(12) United States Patent
Yuan et al.

(10) Patent No.: US 12,740,038 B2
(45) Date of Patent: Sep. 15, 2026

(54) PROCESS METHOD FOR IMPROVING SRAM OPERATING SPEED

(71) Applicant: Shanghai Huali Integrated Circuit Corporation, Shanghai (CN)

(72) Inventors: Yuan Yuan, Shanghai (CN); Zhi Tian, Shanghai (CN); Feng Ji, Shanghai (CN); Tao Liu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 400 days.

(21) Appl. No.: 18/619,360

(22) Filed: Mar. 28, 2024

(65) Prior Publication Data

US 2024/0357791 A1 Oct. 24, 2024

(30) Foreign Application Priority Data

Apr. 19, 2023 (CN) ......................... 202310423439.4

(51) Int. Cl.
*H10B 10/00* (2023.01)
*G03F 1/48* (2012.01)
*G03F 1/80* (2012.01)
*G03F 7/16* (2006.01)

(52) U.S. Cl.
CPC ............... *H10B 10/18* (2023.02); *G03F 1/48* (2013.01); *G03F 1/80* (2013.01); *G03F 7/162* (2013.01)

(58) Field of Classification Search
CPC ........ H10B 10/18; H10B 10/00; H10B 10/12; G03F 1/48; G03F 1/80; G03F 7/162
See application file for complete search history.

(56) References Cited

U.S. PATENT DOCUMENTS 12,501,648 B2 * 12/2025 Tian ........................ H10D 30/65
12,635,231 B2 * 5/2026 Hsu ...................... H10D 84/834
2006/0094229 A1 * 5/2006 Ema .................... H10W 20/081 257/E21.507
2018/0019262 A1 * 1/2018 Oh ..................... H10D 30/0213
2025/0221033 A1 * 7/2025 Yang .................. H10D 84/0142

* cited by examiner

*Primary Examiner* — J. E. Schoenholtz
(74) *Attorney, Agent, or Firm* — Banner & Witcoff, Ltd.

(57) ABSTRACT

A method making a SRAM includes forming a low voltage region, a medium voltage region, and a high voltage region in an active region; forming a low voltage PMOS active region and a low voltage NMOS active region in the low voltage region; forming an STI region between the low voltage PMOS active region and the low voltage NMOS active region; covering the SRAM structure with an oxide layer and an HTO film layer; forming a hard mask on the HTO film layer; performing photolithography to expose the hard mask on the active low voltage region; removing the exposed hard mask from the active low voltage region and removing the HTO film layer and the oxide layer below the hard mask.

9 Claims, 3 Drawing Sheets

PROCESS METHOD FOR IMPROVING SRAM OPERATING SPEED

CROSS-REFERENCE TO RELATED APPLICATIONS

This application claims priority to Chinese patent application No. 202310423439.4, filed on Apr. 19, 2023, the disclosure of which is incorporated herein by reference in its entirety.

TECHNICAL FIELD

The present application relates to the technical field of semiconductors, and in particular, to a process method for improving an SRAM operating speed.

BACKGROUND

With the social media development, comes the demand for increase of speed and size shrinkage of semiconductor devices, thereby the increasingly higher requirements for semiconductor process integration level. Operations of semiconductor NMOS and PMOS devices rely on electrons and holes respectively as majority carriers for forming electric currents. Studies have shown that the mobility of holes is lower than the mobility of electrons. Therefore, finding a way to improve the hole mobility has become an urgent challenge at the high submicron technology nodes.

At the semiconductor 28 nm technology node, in order to improve the carrier mobility of the PMOS devices, a germanium-silicon (Si—Ge) process has been applied to the process, the mobility rate of holes is improved by forming Si—Ge trenches at the source and the drain of the PMOS device respectively thus forming a Si—Ge compound inside the trenches, which improves the speed of the PMOS device. Although the speed of the PMOS device may be improved through the Si—Ge process, the requirements for the morphology of the Si—Ge trenches in the specific formation, as well as the requirements for the ratio of the Si—Ge compound in the formation, are often too stringent to meet. Accordingly, this process has become one of the key points for determining the operation speed of the PMOS device. Furthermore, the within-wafer uniformity and lot-to-lot uniformity of the PMOS devices are often difficult to control during a practical 28HV process. Thus, how to improve the performance of the PMOS devices and guarantee their uniformity has been one of the main problems facing the 28HV process at the current time. Conventional preparation methods (i.e., using a non-Si—Ge process for the source and drain of the PMOS) may be used to solve the problem of uniformity and save the process cost, however, the performance of such devices at the same size can degrade by about 50%. Therefore, how to improve the performance of the PMOS devices by using the conventional fabrication method so not to increase the process cost or the device area has become a challenging problem.

BRIEF SUMMARY

The present application provides a process method for increasing an SRAM operating speed, so the performance of the PMOS device is improved by applying the conventional fabrication method, thereby the device area is not increased and the process cost is not raised.

The process method for increasing the SRAM operating speed according to one embodiment of the present application, at least includes:

step I, providing a semiconductor structure, wherein the semiconductor structure includes a substrate and an active region on the substrate; forming a low voltage region, a medium voltage region, and a high voltage region in an active region; forming a low voltage PMOS active region and a low voltage NMOS active region in the low voltage region;

forming an STI region between the low voltage PMOS active region and the low voltage NMOS active region, and between the medium voltage region and the high voltage region in the active region; and covering the semiconductor structure with an oxide layer and an HTO (High Temperature Oxide) film layer;

step II, forming a hard mask on the HTO film layer of the semiconductor structure;

step III, spin-coating the hard mask with a photoresist, and performing photolithography to expose the hard mask on the low voltage region of the active region;

step IV, etching off the exposed hard mask from the low voltage region and the HTO film layer and the oxide layer below the hard mask, thereby exposing the low voltage PMOS active region and the low voltage NMOS active region and exposing the STI region between the low voltage PMOS active region and the low voltage NMOS active region, wherein an etching rate is controlled so that the height of the STI region between the low voltage PMOS active region and the low voltage NMOS active region is less than a height of each of the low voltage PMOS active region and the low voltage NMOS active region; and step V, removing the remaining hard mask.

In an example, the oxide layer is formed using an In-Situ Steam Generation (ISSG) method in step I.

In an example, the medium voltage region of the active region in step I includes a medium voltage PMOS active region and a medium voltage NMOS active region.

In an example, the high voltage region of the active region in step I includes a high voltage PMOS active region and a high voltage NMOS active region.

In an example, the hard mask is formed using a deposition method in step II.

In an example, after the hard mask and the HTO film layer and the oxide layer below the hard mask are removed in step IV, the photoresist on a hard mask layer on the medium voltage region and the high voltage region of the active region of is removed, thereby exposing the hard mask on he medium voltage region and the high voltage region of the active region.

In an example, the low voltage region in step I further includes an SRAM region of the low voltage region.

In an example, the low voltage PMOS in step I is also provided with an STI region on a side away from the low voltage NMOS.

In an example, the STI region on the side of the low voltage PMOS active region away from the low voltage NMOS active region is also exposed after the etching in step IV, and the etching rate is controlled so that the height of the STI region on the side of the low voltage PMOS active region away from the low voltage NMOS active region is less than the height of each of the low voltage PMOS active region and the low voltage NMOS active region.

As stated above, the process method for improving an SRAM operating speed of the present application has the following beneficial effects: the present application reduces an STI depth to increase an effective channel width of the PMOS device, resulting in a speed of the PMOS device of a 28HV platform to be consistent with the original one without the use of a Si—Ge process and improves the uniformity problem, not only meeting the requirements of the 28HV platform for the PMOS, but also saving the process cost and alleviating the problem of an insufficient production capacity of on-line Si—Ge equipment.

DETAILED DESCRIPTION OF THE DISCLOSURE

The embodiments of the present application are described below using specific examples, and those skilled in the art could readily understand other advantages and effects of the present application from the contents disclosed in the specification. The present application may also be implemented or applied using other different specific implementations, and various details in the specification may also be modified or changed based on different viewpoints and applications without departing from the spirit of the present application.

Please refer to FIGS. 1-5. It should be noted that the drawings provided in the embodiments are only intended to illustrate the basic concept of the present application in a schematic way, so the drawings only show the components related to the present application rather than being drawn according to the number, shape, and size of the components in actual implementations. The type, number, and proportion of various components can be changed randomly in the actual implementations, and the layout of the components may be more complicated.

The present application provides a process method for improving an SRAM operating speed, the method at least includes the following steps.

Step I. forming a semiconductor structure on a substrate, wherein the semiconductor structure includes an active region; forming an active region of a low voltage region, an active region of a medium voltage region, and an active region of a high voltage region in the active region; and forming a low voltage PMOS active region and a low voltage NMOS active region in the active region of the low voltage region includes.

An STI region is formed between the low voltage PMOS active region and the low voltage NMOS active region, as well as between the active region of the medium voltage region and the active region of the high voltage region; and the semiconductor structure is covered with an oxide layer and an HTO film layer.

Figure 1:
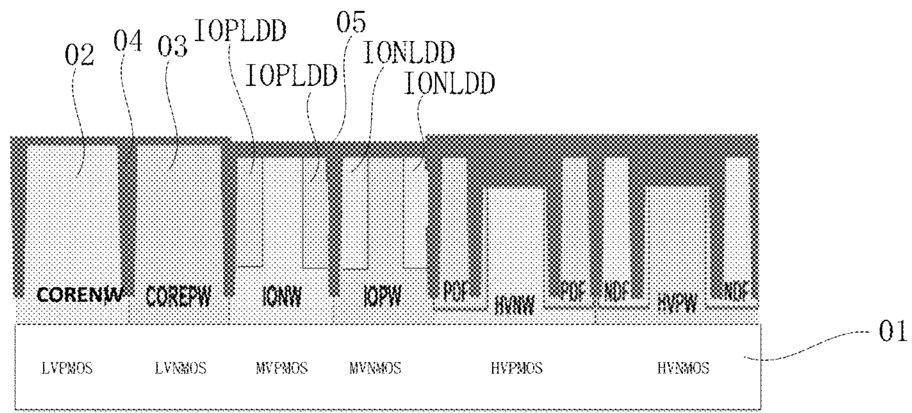
FIG. 1 illustrates a schematic diagram of a semiconductor structure according to one embodiment of the present application.

FIG. 1 illustrates a schematic diagram of the semiconductor structure of the present application. The semiconductor structure includes the substrate 01 and the active region on the substrate 01; the active region includes the active region of the low voltage region, the active region of the medium voltage region, and the active region of the high voltage region. The active region of the low voltage region includes the low voltage PMOS active region 02 (CORENW in FIG. 1) and the low voltage NMOS active region 03 (COREPW in FIG. 1). The LVPMOS in FIG. 1 is a low voltage PMOS formed directly in a region above the substrate 01. Similarly, the LVNMOS in FIG. 1 a low voltage NMOS formed directly in a region above the substrate 01.

According to this embodiment of the present application, the active region of the medium voltage region in step I includes a medium voltage PMOS active region and a medium voltage NMOS active region. In this embodiment of the present application, the active region of the high voltage region in step I includes a high voltage PMOS active region and a high voltage NMOS active region. The MVPMOS in FIG. 1 is the medium voltage PMOS formed in a region directly above the substrate 01. The MVNMOS in FIG. 1 is the medium voltage NMOS formed in a region directly above the substrate 01. The HVPMOS in FIG. 1 is the high voltage PMOS formed in a region directly above the substrate 01. The HVNMOS in FIG. 1 is the high voltage NMOS formed in a region directly above the substrate 01.

In FIG. 1, the STI region 04 (all STI regions in FIG. 1 are referenced as 04 even though not all are labeled in FIG. 1) is formed between the low voltage PMOS active region 02 and the low voltage NMOS active region 03, and between the active region of the medium voltage region and the active region of the high voltage region; the semiconductor structure is covered with the oxide layer and the HTO film layer. The oxide layer and the HTO film layer in FIG. 1 are both referenced as 05.

According to this embodiment of the present application, the oxide layer and HTO layer 05 are formed in step I using an In-Situ Steam Generation (ISSG) method.

According to this embodiment of the present application, the low voltage region in step I further includes a low voltage region comprised of an SRAM region. An SRAM includes a LVPMOS (low voltage PMOS) and a LVNPMOS (low voltage NMOS), here the low voltage region not only forms the SRAM, but also forms other devices in addition to the SRAM.

In this embodiment of the present application, the low voltage PMOS in step I is also provided with an STI region 04 on a side away from the low voltage NMOS. Referring to FIG. 1, the leftmost STI region 04 in FIG. 1 is the STI region on the side of the low voltage PMOS away from the low voltage NMOS. The IONW (IO Nwell) in FIG. 1 is the active region of the medium voltage PMOS and the IO-PLDD (IO P type Lightly Doped Drain) is a PLDD (P type Lightly Doped Drain) region of the medium voltage PMOS. The IOPW (IO Pwell) in FIG. 1 is the active region of the medium voltage NMOS and the IONLDD (IO N type Lightly Doped Drain) is an NLDD (N type Lightly Doped Drain) region of the medium voltage NMOS. A HVNW in FIG. 1 is the active region of high voltage PMOS and the PDF is a P-type diffusion region. The HVPW in FIG. 1 is the active region of the high voltage NMOS and the NDF is an N-type diffusion region.

Step II. A hard mask is formed on the HTO film layer 05 of the semiconductor structure.

Figure 2:
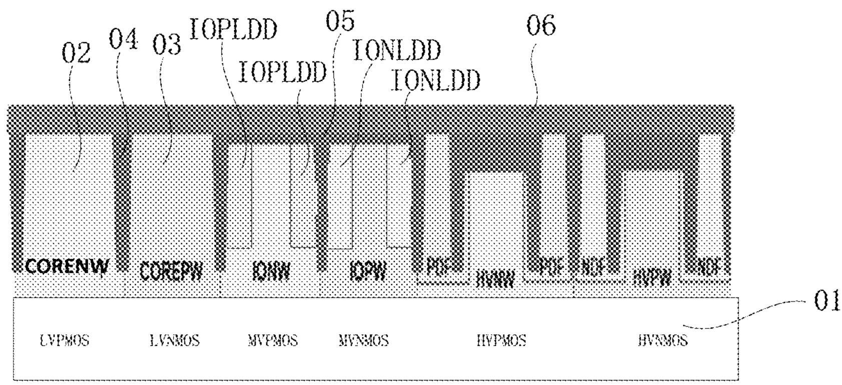
FIG. 2 illustrates a schematic structural diagram of forming a hard mask on the semiconductor structure according to the embodiment of the present application.

In this embodiment of the present application, the hard mask is formed using a deposition method in step II. FIG. 2 illustrates a schematic structural diagram of forming the hard mask on the semiconductor structure in the present application. In step II, the hard mask 06 is formed on the HTO film layer 05 of the semiconductor structure.

Figure 3:
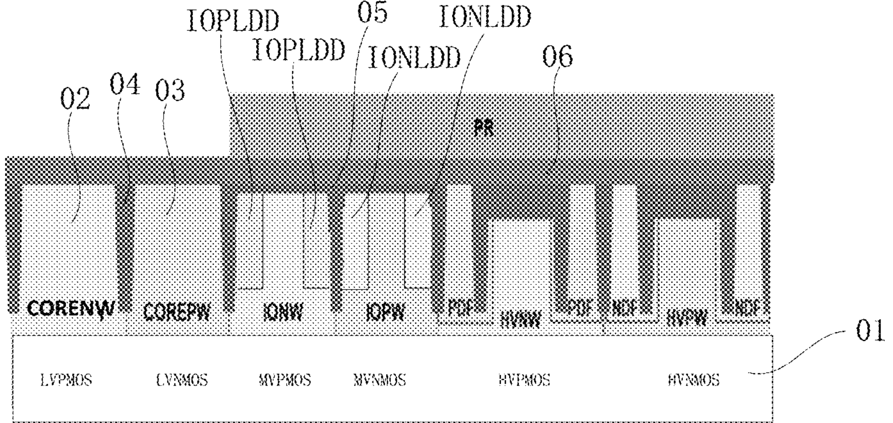
FIG. 3 illustrates a schematic structural diagram of exposing the hard mask on a low voltage region according to the embodiment of the present application.

Step III. The hard mask is spin-coated with a photoresist PR layer, and photolithography is performed to expose the hard mask on the active region of the low voltage region. FIG. 3 illustrates a schematic structural diagram of exposing the hard mask on the low voltage region in the present application. In step III, the hard mask 06 is spin-coated with the photoresist PR, and the photolithography is performed to pattern and expose the hard mask 06 on the active region of the low voltage region.

Figure 4:
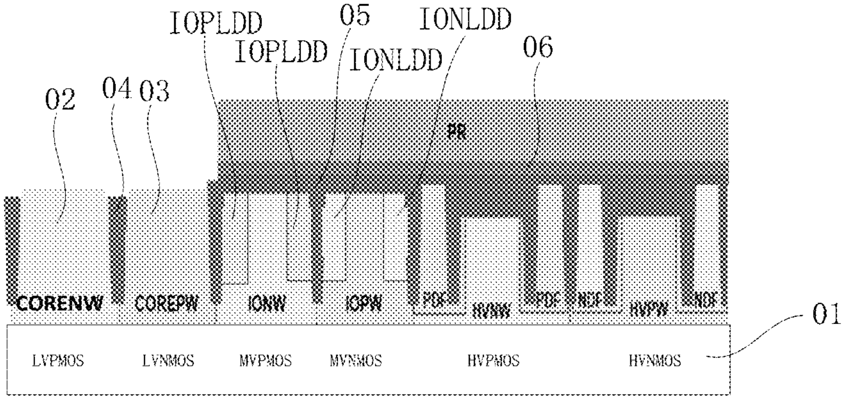
FIG. 4 illustrates a schematic structural diagram of forming an STI region 04 between a low voltage PMOS active region and a low voltage NMOS active region that has a height less than a height of each of the low voltage PMOS active region and the low voltage NMOS active region according to the embodiment of the present application.

Step IV. The exposed hard mask on the active region of the low voltage region and the HTO film layer and the oxide layer 05 below the hard mask are etched off, thereby exposing the low voltage PMOS active region and the low voltage NMOS active region and exposing the STI region between the low voltage PMOS active region and the low voltage NMOS active region, wherein the etching rate is controlled so that the STI region 04 between the low voltage PMOS active region 02 and the low voltage NMOS active region 03 has a height less than a height of each of the low voltage PMOS active region 02 and the low voltage NMOS active region 03. FIG. 4 illustrates a schematic structural diagram of forming the STI region 04 between the low voltage PMOS active region 02 and the low voltage NMOS active region 03 that has a height less than a height of each of the low voltage PMOS active region 02 and the low voltage NMOS active region 03 according to the present application.

In step IV, the exposed hard mask 06 on the active region of the low voltage region and the HTO film layer and the oxide layer 05 below the hard mask 06 are etched off, thereby exposing the low voltage PMOS active region 02 and the low voltage NMOS active region 03 and exposing the STI region 04 between the low voltage PMOS active region 02 and the low voltage NMOS active region 03, wherein the etching rate is controlled so that the STI region 04 between the low voltage PMOS active region 02 and the low voltage NMOS active region 03 has a height less than the height of each of the low voltage PMOS active region 02 and the low voltage NMOS active region 03. That is, the etching rate of the low voltage PMOS active region 02 and the low voltage NMOS active region 03 is slower than the etching rate of the STI region, so that the final height of the STI region 04 is less than the height of the low voltage PMOS active region 02 and the low voltage NMOS active region 03.

Figure 5:
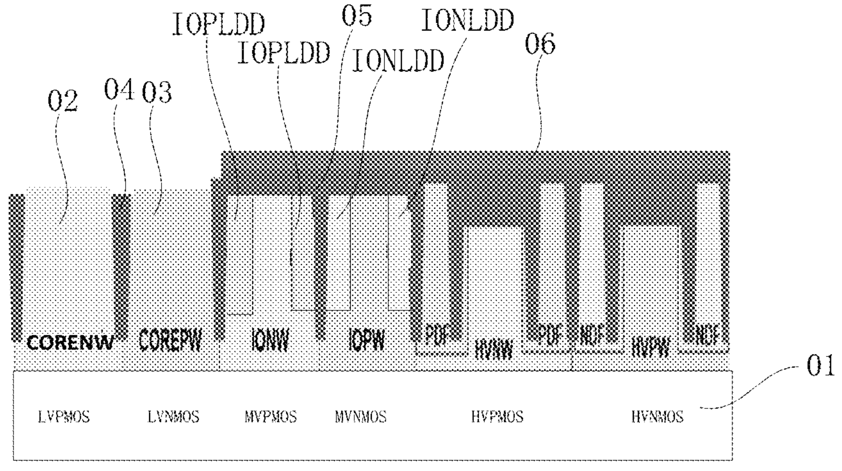
FIG. 5 illustrates a schematic structural diagram of removing a remaining photoresist according to the embodiment of the present application.

In this embodiment of the present application, after the hard mask 06 and the HTO film layer and the oxide layer 05 below the hard mask are removed in step IV, the photoresist PR on a hard mask layer 06 on the active region of the medium voltage region and the active region of the high voltage region is removed, thereby exposing the hard mask 06 on the active region of the medium voltage region and the active region of the high voltage region. Referring to FIG. 5, FIG. 5 illustrates a schematic structural diagram of removing the remaining photoresist PR according to the present application.

In this embodiment of the present application, the leftmost STI region 04 on the side of the low voltage PMOS active region 02 away from the low voltage NMOS active region 03 is also exposed after the etching in step IV, and the etching rate is controlled so that the leftmost STI region 04 on the side of the low voltage PMOS active region 02 away from the low voltage NMOS active region 03 has a height less than the height of each of the low voltage PMOS active region 02 and the low voltage NMOS active region 03.

Figure 6:
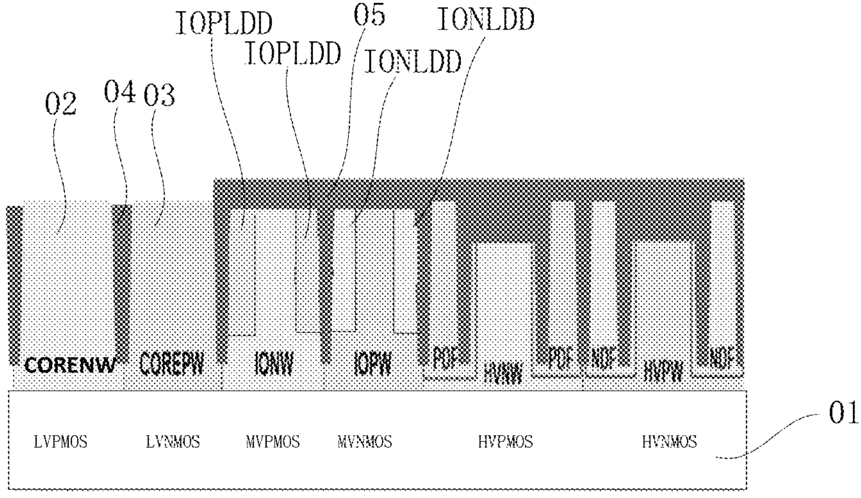
FIG. 6 illustrates a schematic structural diagram of removing the remaining hard mask in the present application.

Step V. The remaining hard mask is removed. Referring to FIG. 6, FIG. 6 illustrates a schematic structural diagram of removing the remaining hard mask 06 in the present application.

To sum up, the process method for improving an SRAM operating speed of the present application has the following beneficial effects: the present application reduces an STI depth to increase an effective channel width of the PMOS, resulting in a speed of the PMOS device of a 28HV platform to be consistent with the original platform without the use of a Si—Ge process and improves the device uniformity, not only meeting the requirements of the 28HV platform for the PMOS devices, but also saving the process cost and alleviating the problem of an insufficient production capacity of on-line Si—Ge equipment. Therefore, the present application effectively overcomes various defects in the prior art and has a high industrial utilization value.

The above embodiments merely illustrate the principle and effect of the present application, rather than for limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A process method for improving an SRAM operating speed, at least comprising:

step I, providing a semiconductor structure, wherein the semiconductor structure comprises a substrate and an active region on the substrate; forming a low voltage region, a medium voltage region, and a high voltage region in the active region; and forming a low voltage PMOS active region and a low voltage NMOS active region in the low voltage region; forming an STI region between the low voltage PMOS active region and the low voltage NMOS active region, and between the medium voltage region and the high voltage region in the active region; and forming an oxide layer and a high temperature oxide (HTO) film layer to cover the semiconductor structure;

step II, forming a hard mask on the HTO film layer;

step III, spin-coating the hard mask with a photoresist layer, and performing photolithography to expose the hard mask on the low voltage region in the active region;

step IV, etching off the exposed hard mask on the low voltage region of the active region and the HTO film layer and the oxide layer below the hard mask, thereby exposing the low voltage PMOS active region and the low voltage NMOS active region and exposing the STI region between the low voltage PMOS active region and the low voltage NMOS active region, wherein an etching rate is controlled so that a first height of the STI region between the low voltage PMOS active region and the low voltage NMOS active region is less than a height of each of the low voltage PMOS active region and the low voltage NMOS active region; and step V, removing a remaining hard mask unexposed after the etching off.

2. The process method for improving the SRAM operating speed according to claim 1, wherein, in step I, the oxide layer is formed using an ISSG (In-Situ Steam Generation) method.

3. The process method for improving the SRAM operating speed according to claim 1, wherein the step I further comprises forming a medium voltage PMOS active region and a medium voltage NMOS active region in the medium voltage region.

4. The process method for improving the SRAM operating speed according to claim 1, wherein the step I further comprises forming a high voltage PMOS active region and a high voltage NMOS active region in the high voltage region.

5. The process method for improving the SRAM operating speed according to claim 1, wherein the forming the hard mask comprises a deposition method in step II.

6. The process method for improving the SRAM operating speed according to claim 1, wherein, in the step IV, after removing the hard mask, the HTO film layer and the oxide layer below the hard mask, the method further comprises removing the photoresist from the hard mask layer on the medium voltage region and the high voltage region in the active region, thereby exposing the hard mask on the medium voltage region and the high voltage region of the active region.

7. The process method for improving the SRAM operating speed according to claim 1, wherein the low voltage region in step I further comprises an SRAM region.

8. The process method for improving the SRAM operating speed according to claim 1, wherein the low voltage PMOS active region in step I is also provided with an STI region on a side away from the low voltage NMOS active region.

9. The process method for improving the SRAM operating speed according to claim 8, wherein the STI region on the side of the low voltage PMOS active region away from the low voltage NMOS active region is also exposed after the etching in step IV, wherein an etching rate is controlled so that a second height of the STI region on the side of the low voltage PMOS active region away from the low voltage NMOS active region is less than the height of each of the low voltage PMOS active region and the low voltage NMOS active region.

* * * * *